(12) United States Patent
Yoon et al.

(10) Patent No.: US 7,858,974 B2
(45) Date of Patent: Dec. 28, 2010

(54) ORGANIC LIGHT-EMITTING DISPLAY PANEL AND METHOD OF MANUFACTURING THE SAME

(75) Inventors: Young Soo Yoon, Suwon-si (KR); Joon Chul Goh, Seoul (KR); Beohm Rock Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 506 days.

(21) Appl. No.: 12/039,197

(22) Filed: Feb. 28, 2008

(65) Prior Publication Data

US 2008/0230770 A1    Sep. 25, 2008

(30) Foreign Application Priority Data

Mar. 20, 2007   (KR) .................. 10-2007-0026889

(51) Int. Cl.
*H01L 29/08* (2006.01)
*H01L 35/24* (2006.01)
*H01L 51/00* (2006.01)

(52) U.S. Cl. .......................... 257/40; 257/59; 257/642; 257/290; 257/72; 257/E21.413; 438/30; 438/59; 438/66; 438/82; 438/96; 313/505; 349/39; 349/141

(58) Field of Classification Search ............... 257/40, 257/59, 72, 290, 291, 642, E21.413, E27.113; 438/30, 59, 65, 66, 74, 82, 96; 313/505; 313/169.3; 349/39, 141
See application file for complete search history.

(56) References Cited

U.S. PATENT DOCUMENTS

| | | | | |
|---|---|---|---|---|
| 6,835,954 B2 * | 12/2004 | Park et al. | ...................... | 257/72 |
| 6,921,918 B2 * | 7/2005 | Park et al. | ...................... | 257/72 |
| 7,052,930 B2 * | 5/2006 | Park et al. | ...................... | 438/66 |
| 7,094,624 B2 * | 8/2006 | Park et al. | ...................... | 438/82 |
| 7,132,801 B2 * | 11/2006 | Park et al. | ................. | 315/169.3 |
| 7,164,230 B2 * | 1/2007 | Park | .......................... | 313/505 |
| 7,247,878 B2 * | 7/2007 | Park et al. | ...................... | 257/40 |
| 7,550,306 B2 * | 6/2009 | Park et al. | ...................... | 438/30 |
| 2002/0180897 A1 * | 12/2002 | Chae | .......................... | 349/39 |
| 2004/0048546 A1 * | 3/2004 | Sakamoto et al. | ............. | 445/24 |
| 2006/0290864 A1 * | 12/2006 | Oh et al. | ..................... | 349/141 |
| 2008/0023717 A1 * | 1/2008 | Choi et al. | ..................... | 257/98 |

FOREIGN PATENT DOCUMENTS

| | | |
|---|---|---|
| JP | 2003-08033 | 4/2003 |
| KR | 1020030058152 | 7/2003 |
| KR | 1020060104211 | 10/2006 |

* cited by examiner

*Primary Examiner*—Zandra Smith
*Assistant Examiner*—Telly D Green
(74) *Attorney, Agent, or Firm*—Innovation Counsel LLP

(57) ABSTRACT

An organic light-emitting display panel having a storage capacitor comprised of a storage electrode overlapping a power line with a first gate-insulating layer disposed therebetween, wherein the storage capacitor includes a groove portion formed on a lateral side of the power line overlapping the storage electrode so that the overlapping area of the power line and the storage electrode is kept constant, and a method of manufacturing the same.

15 Claims, 24 Drawing Sheets

ORGANIC LIGHT-EMITTING DISPLAY PANEL AND METHOD OF MANUFACTURING THE SAME

CROSS-REFERENCE TO RELATED APPLICATION

This application claims priority to and the benefit of Korean Patent Application No. 10-2007-0026889, filed on Mar. 20, 2007, the disclosure of which is incorporated herein by reference in its entirety.

BACKGROUND OF THE INVENTION

1. Field of the Invention

The present invention relates to display panels and, more particularly, to an organic light-emitting display panel and a method of manufacturing the same which prevents formation of a defective storage capacitor.

2. Description of the Related Art

Organic light-emitting displays emit light generated when electrons and holes are paired after an electric charge is injected into the organic light-emitting layer. The organic light-emitting display is a next-generation device that can be driven with low voltage and has low power consumption.

In the organic light-emitting display, a switching transistor is turned on by a scan pulse supplied from a gate line and a data signal applied from a data line. The data signal from the switching transistor is charged to a storage capacitor that drives a driving transistor for one frame period. This allows an electric current from a power line to be supplied to the organic light-emitting diode. A storage electrode connected to a gate electrode of the driving transistor overlaps the power line, thus forming the storage capacitor.

Misalignment of the mask used for forming the storage electrode may result in a defective storage capacitor. Shifting of the storage electrode to the top, bottom, left or right of the correct position will result in changing the capacity of the storage capacitor at a pixel, causing a brightness difference.

SUMMARY OF THE INVENTION

Accordingly, the present invention provides an organic light-emitting display panel and a method of manufacturing the organic light-emitting display panel in which the overlapping area of a power line and a storage electrode is kept the same and thus the capacity of a storage capacitor provided at each pixel is the same as each other.

In accordance with an aspect of the present invention, an organic light-emitting display panel comprises: a gate line and a data line formed to cross each other on a substrate; an organic light-emitting diode formed in a pixel area defined by the intersection of the gate line and the data line; a power line formed parallel to the data line and supplying an electric current to the organic light-emitting diode; a switching transistor provided at the intersection of the gate line and the data line; a driving transistor connected to the switching transistor and the power line to control the current supplied from the power line; and a storage capacitor composed of a storage electrode overlapping the power line with a first gate-insulating layer disposed therebetween, wherein the storage capacitor includes a groove portion formed on a lateral side of the power line overlapping the storage electrode so that the overlapping area of the power line and the storage electrode is kept the same.

The groove portion may be formed on a lateral side adjacent to the data line.

The groove portion may have a length at least equal to or greater than a length between the top and bottom of the storage electrode.

The storage electrode may have a width greater than that of an overlapping area of the storage electrode and the power line.

The organic light-emitting display panel may further include an auxiliary storage electrode extending from the storage electrode to overlap the power line.

The auxiliary storage electrode may have a width smaller or larger than that of the power line.

The driving transistor may include: a first semiconductor pattern formed of polysilicon on the substrate; a first source electrode formed on the first semiconductor pattern and connected to the power line; a first drain electrode formed on the first semiconductor pattern to face the first source electrode and connected to the organic light-emitting diode; a second gate-insulating layer formed on the first source electrode and the first drain electrode; and a first gate electrode formed on the second gate-insulating layer to overlap the first semiconductor pattern.

The first gate electrode may be electrically connected to the storage electrode.

The switching transistor may include: a second gate electrode formed on the first gate-insulating layer; the second gate-insulating layer formed on the second gate electrode; a second semiconductor pattern formed of amorphous silicon on the substrate; and a second source electrode and a second drain electrode formed on the second semiconductor pattern to face each other.

The organic light-emitting display panel may further include a bridge electrode connecting the first gate electrode to the second drain electrode.

In accordance with another aspect of the present invention, there is provided a method of manufacturing an organic light-emitting display panel, the method including: forming a gate line and a data line on a substrate, the gate line and the data line crossing each other with a gate-insulating layer disposed therebetween; forming an organic light-emitting diode in a pixel area defined by the intersection of the gate line and the data line; forming a switching transistor at the intersection of the gate line and the data line; forming a driving transistor connected to the switching transistor; forming a power line parallel to the data line; and forming a storage electrode overlapping the power line with the gate-insulating layer disposed therebetween to form a storage capacitor and including a projecting portion with respect to a lateral side of the power line.

The process of forming the power line parallel to the data line may further include forming a groove portion on a lateral side adjacent to the data line in an overlapping area of the storage electrode and the power line.

The process of forming the groove may further include forming the groove portion to have a length at least equal to or greater than a length between the top and bottom of the storage electrode.

The process of forming the storage electrode may further include forming an auxiliary storage electrode extending from the storage electrode to overlap the power line.

The process of forming the auxiliary storage electrode may further include forming the auxiliary storage electrode to have a width smaller or larger than that of the power line.

The process of forming the switching transistor and the driving transistor may include: forming a first semiconductor pattern with polysilicon on the substrate and a first gate-insulating layer; forming a source electrode on the first semiconductor pattern and connected to the power line, and a first drain electrode facing the first source electrode; forming a second gate-insulating layer on the first source electrode and the first drain electrode; forming a first gate electrode on the second gate-insulating layer to overlap the first semiconductor pattern, and a second gate electrode simultaneously with the first gate electrode; and forming a third gate-insulating layer, a second semiconductor pattern, a second source electrode, and a second drain electrode.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

Figure 1:
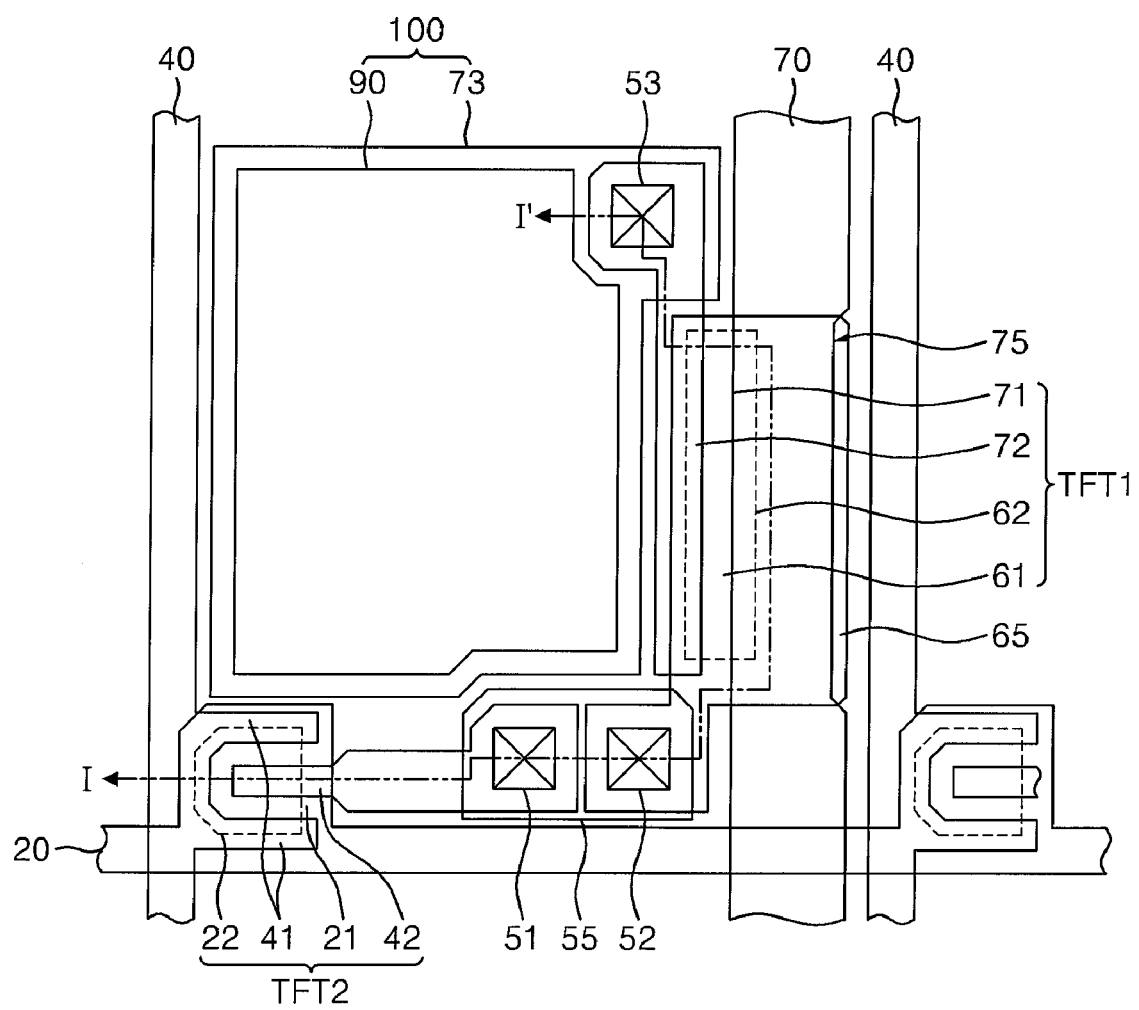
FIG. 1 is a plan view of an organic light-emitting display panel in accordance with a first embodiment of the present invention.
Figure 2:
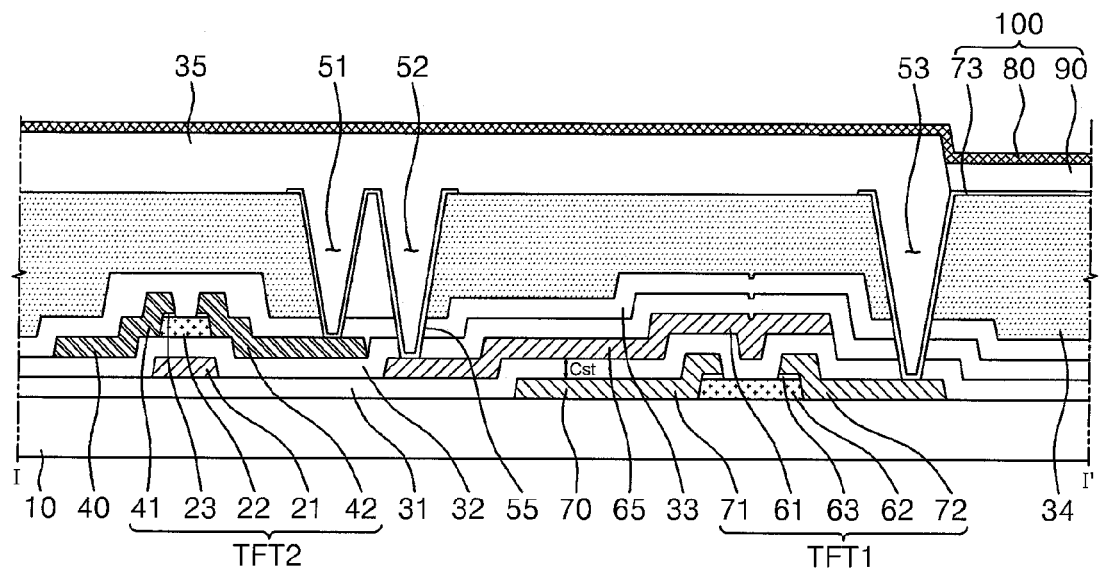
FIG. 2 is a cross-sectional view taken along line I-I' of FIG. 1.

FIG. 1 is a plan view of an organic light-emitting display panel in accordance with a first embodiment of the present invention, and FIG. 2 is a cross-sectional view taken along line I-I' of FIG. 1.

Referring to FIGS. 1 and 2, the organic light-emitting display panel in accordance with the present invention includes a gate line 20, a data line 40, an organic light-emitting diode 100, and a power line 70. Each pixel area includes a switching transistor TFT2, a driving transistor TFT1, and a storage capacitor Cst. The gate line 20 supplies a scan pulse and is connected to a second gate electrode 21 of the switching transistor TFT2. The data line 40 supplies a data signal and is connected to a second source electrode 41 of the switching transistor TFT2. The power line 70 is formed parallel to the data line 40 and crosses the gate line 20 with a first gate-insulating layer 31 disposed therebetween. The power line 70 supplies an electric current to the organic light-emitting diode 100 and is connected to a first source electrode 71 of the driving transistor TFT1.

The driving transistor TFT1 controls the electric current supplied from the power line 70 to the organic light-emitting diode 100 in response to the data signal applied to a first gate electrode 61 thereof, thus adjusting the light-emitting amount of the organic light-emitting diode 100. The driving transistor TFT1 includes the first gate electrode 61 connected a second drain electrode 42 of the switching transistor TFT2, the first source electrode 71 connected to the power line 70, a first drain electrode 72 facing the first source electrode 71 and connected to an anode electrode 73 of the organic light-emitting diode 100, and a first semiconductor pattern forming a channel portion between the first source electrode 71 and the first drain electrode 72.

The first semiconductor pattern includes a first semiconductor layer 62 overlapping the first gate electrode 61 with a first gate-insulating layer 31 disposed therebetween, and a first ohmic contact layer 63 formed on the first semiconductor layer 62 except for the channel portion to form ohmic contact with the first source electrode 71 and the first drain electrode 72.

The first semiconductor layer 62 may be formed of amorphous silicon or polysilicon. The first semiconductor layer 62 may be formed of polysilicon to ensure a longer lifespan in view of the characteristics of the driving transistor TFT1 in which an electric current flows continuously during the light emission period of the organic light-emitting diode 100. If the first semiconductor layer 62 is formed of polysilicon, the driving transistor TFT1 may have a top-gate structure in which the first gate electrode 61 is formed on the first semiconductor layer 62 as shown in FIG. 2.

When the gate line 20 is supplied with the scan pulse, the switching transistor TFT2 is turned on and the data signal applied to the data line 40 is supplied to the storage capacitor Cst and the first gate electrode 61 of the driving transistor TFT1. For this, the switching transistor TFT2 includes the second gate electrode 21 connected to the gate line 20, the second source electrode 41 connected to the data line 40, the second drain electrode 42 facing the second source electrode 41 and connected to the first gate electrode 61 of the driving transistor TFT1 and the storage capacitor Cst, and a second semiconductor pattern forming a channel portion between the second source electrode 41 and the second drain electrode 42.

The second semiconductor pattern includes a second semiconductor layer 22 overlapping the second gate electrode 21 with the second gate-insulating layer 32 disposed therebetween, and a second ohmic contact layer 23 formed on the second semiconductor layer 22 except for the channel portion to form ohmic contact with the second source electrode 41 and the second drain electrode 42.

The second semiconductor layer 22 may be formed of amorphous silicon or polysilicon. Preferably, the second semiconductor layer 22 is formed of amorphous silicon which is advantageous to the on-off operation since the switching transistor TFT2 requires excellent on-off characteristics.

The second drain electrode 42 and the first gate electrode 61 are connected to each other through a bridge electrode 55. The second drain electrode 42 is exposed by a first contact hole 51, and the first gate electrode 61 is exposed by a second contact hole 52. Accordingly, the second drain electrode 42 and the first gate electrode 61 are connected through the bridge electrode 55 passing through the first and second contact holes 51 and 52. The bridge electrode 55 may be formed of the same material as the anode electrode 73.

A passivation layer 33 is formed on a substrate 10 on which the driving transistor TFT1, the switching transistor TFT2, and the storage capacitor Cst are formed. The passivation layer 33 may comprise an inorganic insulating layer such as silicon oxide (SiOx), silicon nitride (SiNx), or the like, which does not deteriorate the characteristics of the thin film transistor.

The organic light-emitting diode 100 includes the anode electrode 73 formed of a transparent conductive material, a cathode electrode 80 formed of an opaque conductive material and facing the anode electrode 73, and an organic light-emitting layer 90 disposed therebetween.

The organic light-emitting layer 90 emits light in accordance with the amount of the current applied to the anode electrode 73 and the light of the organic light-emitting layer 90 is transmitted toward the anode electrode 73. The organic light-emitting layer 90 may be formed of a low molecular or polymer organic light-emitting material. The organic light-emitting layer 90 may be formed of a low molecular material. In the present embodiment, the organic light-emitting layer 90 is formed independently at each pixel. The organic light-emitting layer 90 may be formed in a triple layer structure in which emissive layers displaying red (R), green (G) and blue (B) are sequentially stacked, in a double layer structure in which emissive layers having a complementary color relationship are stacked, or in a single layer structure composed of an emissive layer emitting white color.

Moreover, a hole transport layer, an electron transport layer, and an electron injection layer may be further provided on the top and bottom of the organic light-emitting layer 90 to improve the light-emitting efficiency and characteristics of the organic light-emitting layer 90.

An organic planarization layer 34 may be further provided to compensate for a step height of the organic light-emitting layer 90. The organic planarization layer 34 includes the first contact hole 51 exposing a portion of the second drain electrode 42 of the switching transistor TFT2 and the second contact hole 52 exposing a portion of the first drain electrode 72 of the driving transistor TFT1. The first and second contact holes 51 and 52 are formed to penetrate the first and second gate-insulating layers 31 and 32, the passivation layer 33, and the organic planarization layer 34. Moreover, a barrier layer 35 is formed on the organic planarization layer 34 to form the organic light-emitting layer 90.

As shown in FIG. 2, the barrier layer 35 is formed on the organic planarization layer 34 to expose the anode electrode 73. The barrier layer 35 brings the organic light-emitting layer 90 into contact with the anode electrode 73.

The anode electrode 73 connected to the first drain electrode 72 of the driving transistor TFT1 receives a power signal and supplies holes. The anode electrode 73 may be formed of a transparent conductive material such as indium tin oxide (ITO), indium zinc oxide (IZO), and indium tin zinc oxide (ITZO) and connected to the first drain electrode 72 through a pixel contact hole 53.

The cathode electrode 80 is formed on the organic light-emitting layer 90. The cathode electrode 80 supplies electrons and reflects light emitted from the organic light-emitting layer 90 toward the anode electrode 73. Accordingly, the cathode electrode 80 is formed of aluminum or aluminum alloy having excellent electron transport capability and reflection performance.

A storage electrode 65 connected to the first gate electrode 61 of the driving transistor TFT1 overlaps the power line 70 with the first gate-insulating layer 31 disposed therebetween, thus forming the storage capacitor Cst. Moreover, as shown in FIG. 3, a groove portion 75 is formed on the power line 70 so that an overlapping area of the storage electrode 65 and the power line 70 is kept the same.

The groove portion 75 is formed on a lateral side of the power line 70 and, preferably, on a lateral side adjacent to the data line 40. As shown in FIG. 1, the groove portion 75 is recessed toward the inside of the power line 70. The groove portion 75 may be recessed at least 1 to 2 μm toward the inside of the power line 70. Accordingly, the width of an area of the power line 70 overlapping the storage electrode 65 is set to be smaller than that of the power line 70 not overlapping the storage electrode 65.

Figure 3:
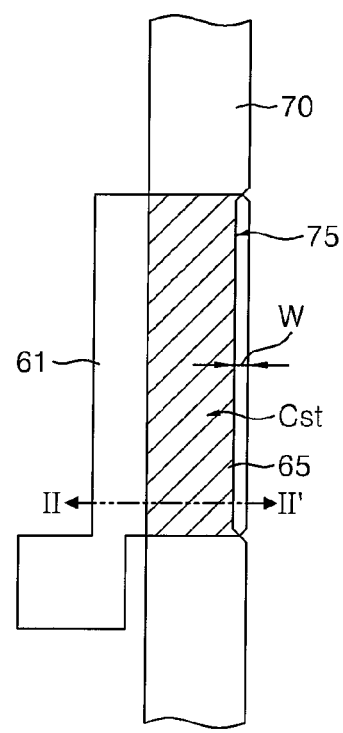
FIG. 3 is a plan view of a storage capacitor of the organic light-emitting display panel of FIG. 1.
Figure 4:
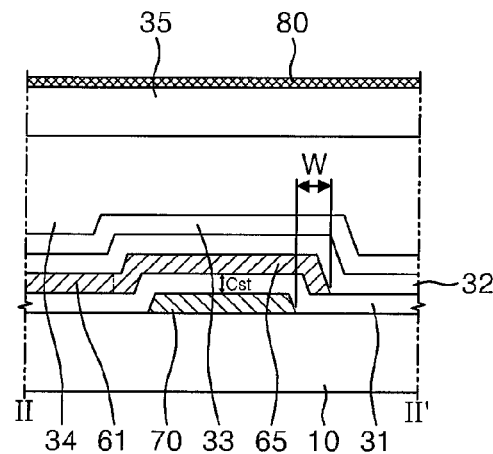
FIG. 4 is a cross-sectional view taken along line II-II' of FIG. 3.

FIG. 3 is a plan view showing an area where the storage capacitor in accordance with the first embodiment of the present invention, and FIG. 4 is a cross-sectional view taken along line II-II' of FIG. 3.

Referring to FIGS. 3 and 4, the storage capacitor Cst is formed by the power line 70 overlapping the storage electrode 65 with the first gate-insulating layer 31 disposed therebetween. The width of the storage electrode 65 is set to be greater than that of the power line 70 by the groove portion 75 formed on the power line 70 in the overlapping area of the storage electrode 65 and the power line 70.

More specifically, the storage capacitor Cst is formed with a predetermined width W between the right lateral side of the storage electrode 65 and the right lateral side of the power line 70 having the groove portion 75. The width W may be 1 to 2 μm. Accordingly, even if the storage electrode 65 is shifted to the left or right, the capacity of the storage capacitor Cst is the same as the previous state, not shifted. A more detailed description will be given with reference to FIGS. 5A and 5B.

Figure 5A:
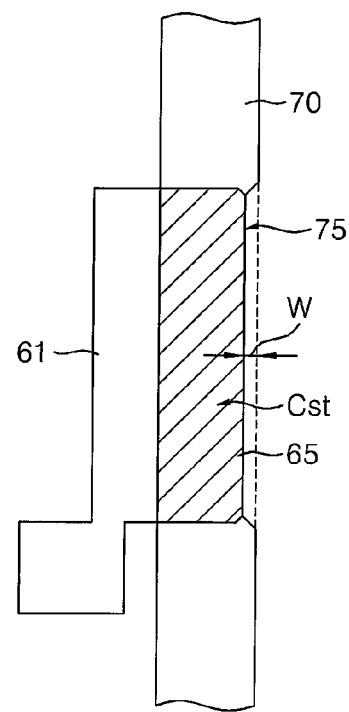
FIGS. 5A and 5B are plan views of a storage electrode shifted to the left and right, respectively.
Figure 5B:
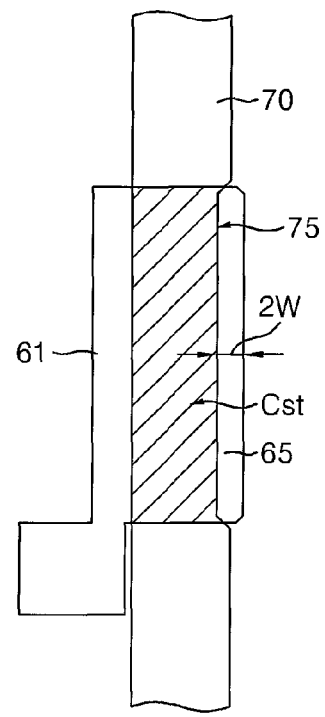

FIG. 5A is a plan view illustrating an overlapping area of the storage electrode and the power line where the storage electrode is shifted to the left, and FIG. 5B is a plan view illustrating an overlapping area of the storage electrode and the power line where the storage electrode is shifted to the right.

As shown in FIG. 5A, even if the storage electrode 65 is shifted to the left, the storage electrode 65 formed to protrude more than the lateral side of the groove portion 75 overlaps the power line 70. Accordingly, the overlapping area of the storage electrode 65 and the power line 70 is the same as that where the storage electrode 65 is not shifted as shown in FIG. 3.

Moreover, the storage electrode 65 is connected to the first gate electrode 61 of the driving transistor TFT1 of FIG. 1. Accordingly, as shown in FIG. 5B, even if the storage electrode 65 is shifted to the right, the first gate electrode 61 overlaps the power line 70 and thus the overlapping area is the same as that where the storage electrode 65 is not shifted.

Figure 6:
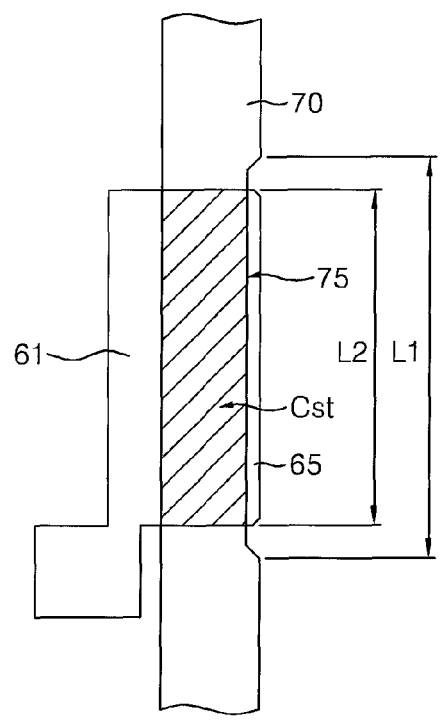
FIG. 6 is a plan view of a storage capacitor of an organic light-emitting display panel in accordance with a second embodiment of the present invention.

FIG. 6 is a plan view of a storage capacitor of an organic light-emitting display panel in accordance with a second embodiment of the present invention.

The storage capacitor Cst of FIG. 6 is the same as that of FIG. 3, except that the length L1 of the groove portion 76 is greater than that of FIG. 3.

Referring to FIG. 6, the groove portion 75 may be formed with a length L1 greater than a length L2 between the top and bottom sides of the storage electrode 65. Accordingly, even if the storage electrode 65 is shifted to the top or bottom due to a mask misalignment, the overlapping area of the storage electrode 65 and the power line 70 can be kept the same.

Figure 7A:
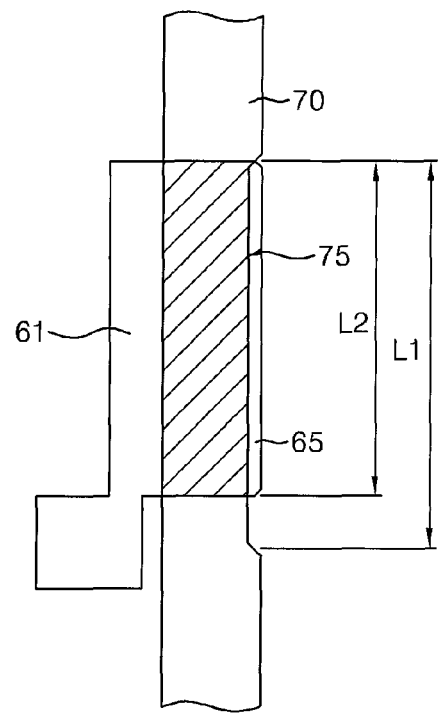
FIGS. 7A and 7B are plan views of a storage electrode in the storage capacitor of FIG. 6 shifted to the top and bottom, respectively.
Figure 7B:
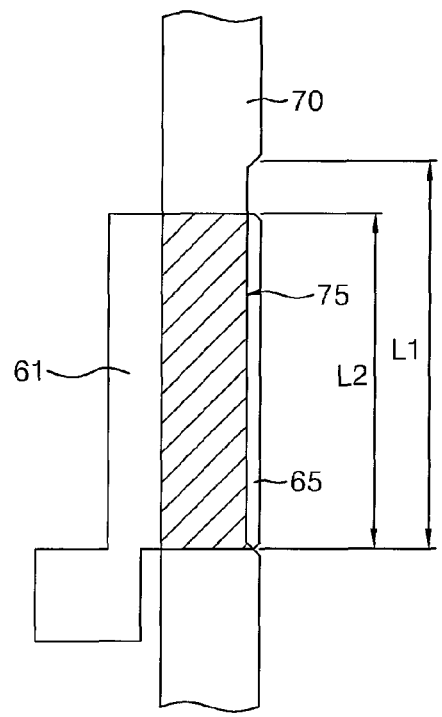

FIG. 7A is a plan view illustrating an overlapping area of the storage electrode and the power line where the storage electrode is shifted to the top, and FIG. 7B is a plan view illustrating an overlapping area of the storage electrode and the power line where the storage electrode is shifted to the bottom.

As shown in FIGS. 7A and 7B, even if the storage electrode 65 is shifted to the top or bottom, the overlapping area of the storage electrode 65 and the power line 70 is kept the same.

Accordingly, the groove portion 75 formed on the power line 70, the capacity of the storage capacitor Cst formed at each pixel is kept the same, even if at least one of the storage electrode 65 and the power line 70 is shifted to the top, bottom, left or right in a process variation. Moreover, each of a plurality of storage capacitors formed on the organic light-emitting display panels manufactured at different times may have the same capacity.

Figure 8:
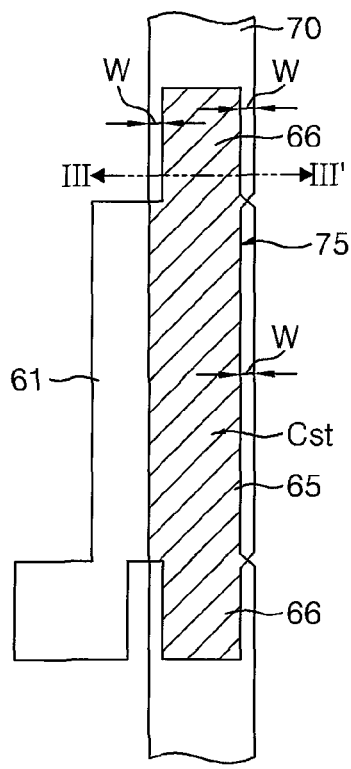
FIG. 8 is a plan view of a storage capacitor of an organic light-emitting display panel in accordance with a third embodiment of the present invention.
Figure 9:
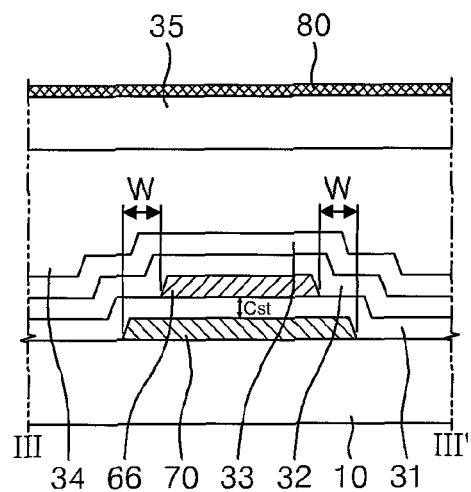
FIG. 9 is a cross-sectional view taken along line III-III' of FIG. 8.

FIG. 8 is a plan view of a storage capacitor of an organic light-emitting display panel in accordance with a third embodiment of the present invention, and FIG. 9 is a cross-sectional view taken along line III-III' of FIG. 8. Since the storage capacitor Cst in accordance with the third embodiment of the present invention includes the same elements as that of FIG. 3, except that an auxiliary storage electrode 66 connected to the storage electrode 65 and overlapping the power line 70 is provided on the storage capacitor Cst, a description thereof will be omitted.

Referring to FIGS. 8 and 9, the storage capacitor Cst may further include the auxiliary storage electrode 66 connected to the storage electrode 65 and overlapping the power line 70.

Figure 10A:
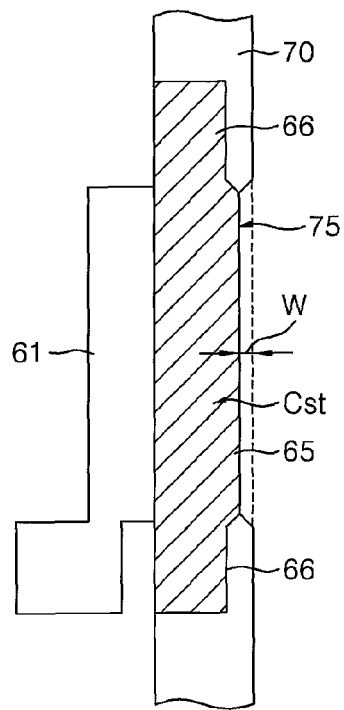
FIGS. 10A and 10B are plan views of a storage electrode and an auxiliary storage electrode shifted to the left and right, respectively.
Figure 10B:
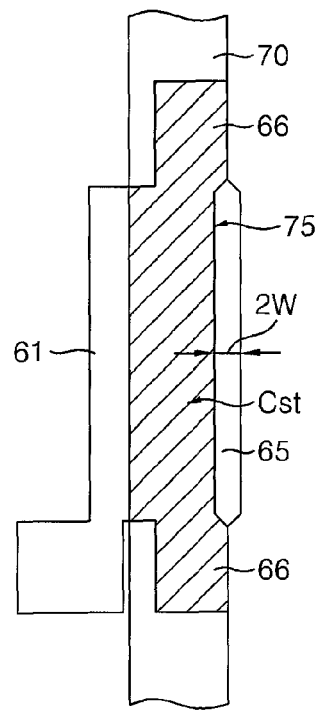

The auxiliary storage electrode 66 is connected to at least one of the top and bottom sides of the storage electrode 65. The auxiliary storage electrode 66 has a width equal to or smaller than that of the power line 70. The auxiliary storage electrode 66 may be formed symmetrically with respect to the center of the power line 70. The width W between a lateral side of the auxiliary storage electrode 66 and a short side of the power line 70 should be 1 to 2 μm. Accordingly, even if the auxiliary storage electrode 66 is shifted to the left or right due to a mask misalignment during the formation of the auxiliary storage electrode 66, as shown in FIGS. 10A and 10B, respectively, the overlapping area of the auxiliary storage electrode 66 and the power line 70 is kept the same, thus making no difference in the capacity of the storage capacitors. Accordingly, the capacity of the storage capacitor Cst provided at each pixel of the organic light-emitting display panel is equal to each other, even if there is a mask misalignment, thus preventing brightness degradation due to the difference in the capacity of the storage capacitors Cst.

The width W between the lateral side of the auxiliary storage electrode 66 and the short side of the power line 70 shown in FIG. 8 may be the same as the width W between the lateral side of the storage electrode 65 and the lateral side of the power line 70 shown in FIG. 3. For example, if the width of the auxiliary storage electrode 66 is the same as that of the power line 70, the auxiliary storage electrode 66 may be shifted to the left or right due to a mask misalignment. At this time, the capacity of the storage capacitor Cst formed at each pixel or on each organic light-emitting display panel may be changed due to the auxiliary storage electrode 66 shifted to the left or right.

Although the foregoing description relates to the auxiliary storage electrode 66 having a narrower width than that of the power line 70, the auxiliary storage electrode 66 may have a width greater than that of the power line 70. That is, when the auxiliary storage electrode 66 has a width greater than that of the power line 70, the overlapping area of the auxiliary storage electrode 66 and the power line 70 is kept the same, even if the auxiliary storage electrode 66 is shifted to the left or right. Where the auxiliary storage electrode 66 has a width greater than that of the power line 70, the auxiliary storage electrode 66 may be formed to have a width in the range that does not overlap the anode electrode 73, when the distance between the anode electrode 73 shown in FIG. 1 and the auxiliary storage electrode 66 is shifted to the right. Moreover, the auxiliary storage electrode 66 may be formed to have a size that does not overlap the adjacent data line 40 shown in FIG. 1, when the auxiliary storage electrode 66 is shifted to the right.

Next, a method of manufacturing an organic light-emitting display panel in accordance with the present invention will be described with reference to FIGS. 11A to 17B.

Figure 11A:
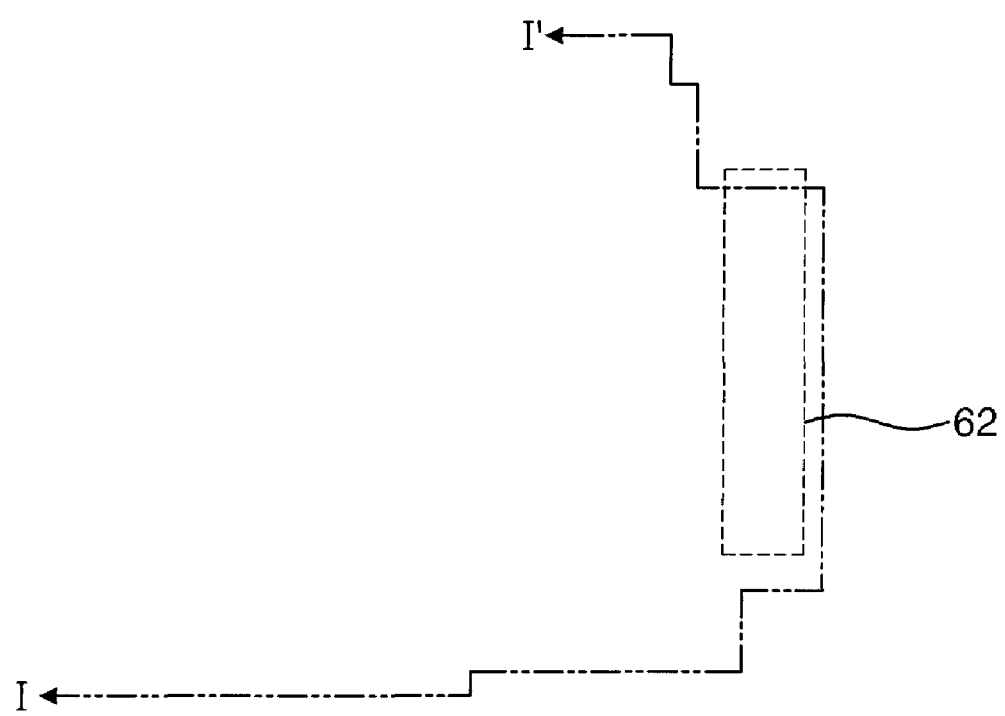
FIGS. 11A to 17B are plan views and cross-sectional views illustrating a method of manufacturing an organic light-emitting display panel in accordance with the present invention.
Figure 11B:
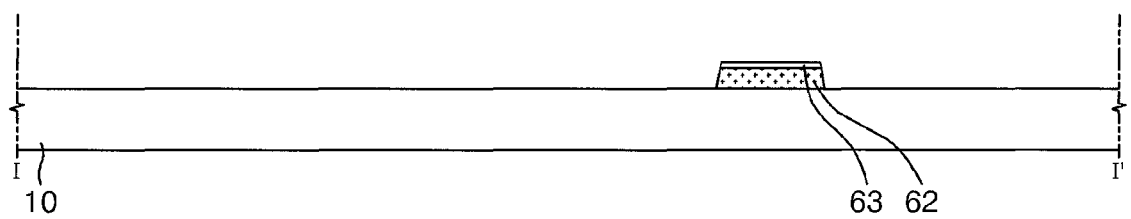

Referring to FIGS. 11A and 11B, a first semiconductor layer 62 of a driving transistor TFT1 and a first ohmic contact layer 63 are formed on a substrate 10.

The first semiconductor layer 62 and the first ohmic contact layer 63 are formed of polysilicon in view of the characteristics of the driving transistor TFT1. The process of forming the first semiconductor layer 62 and the first ohmic contact layer 63 will be described in more detail below.

First, amorphous silicon and impurity-doped amorphous silicon are deposited on the overall surface of the substrate 10 in a uniform thickness. Subsequently, the amorphous silicon is crystallized by laser irradiation or solid phase crystallization using heat and magnetic field. Next, the crystallized silicon layer is patterned by photolithography and etching processes to form the first semiconductor layer 62 and the first ohmic contact layer 63 shown in FIG. 11B.

Figure 12A:
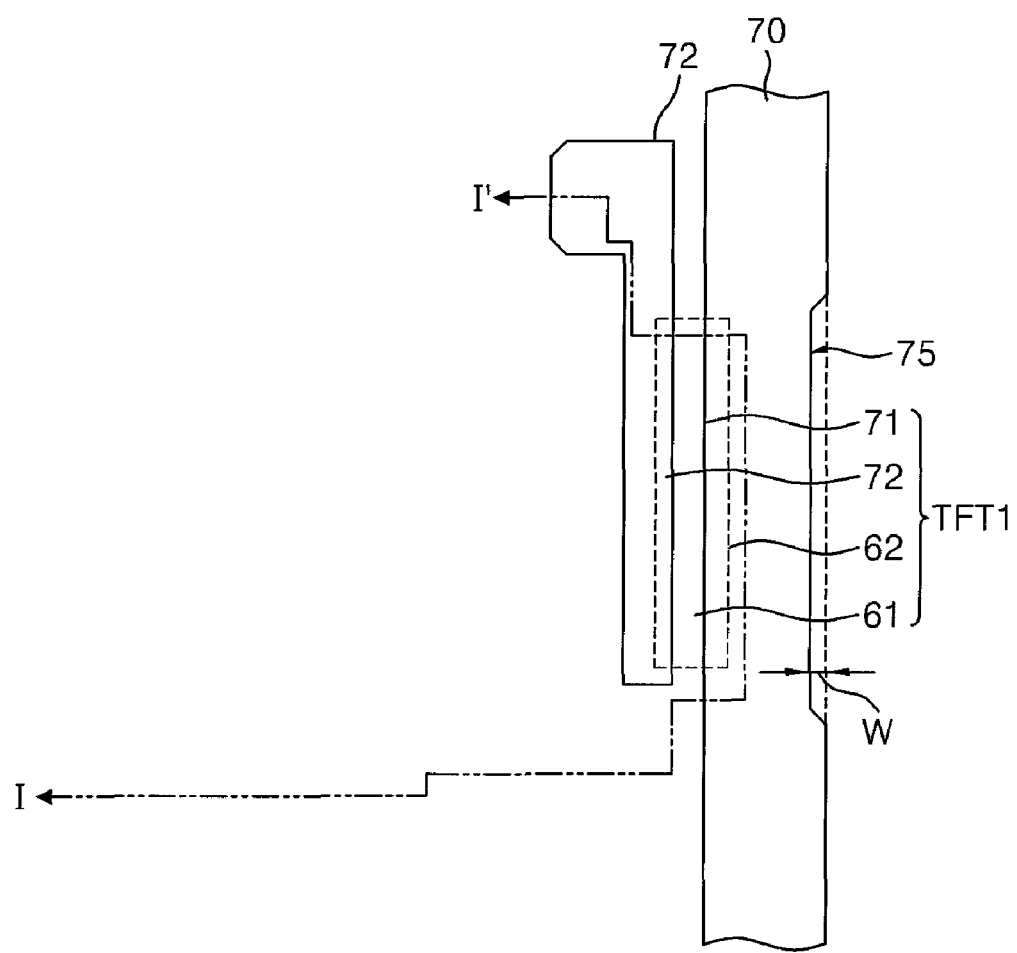
Figure 12B:
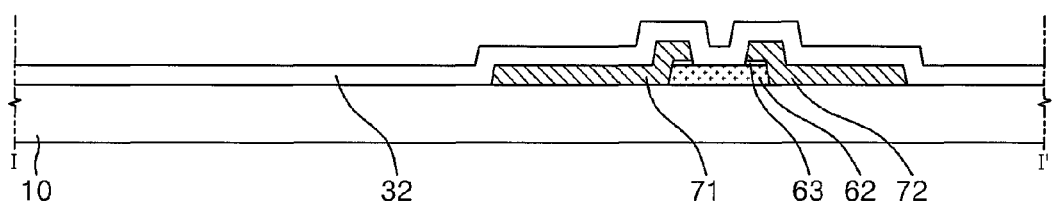
Figure 12C:
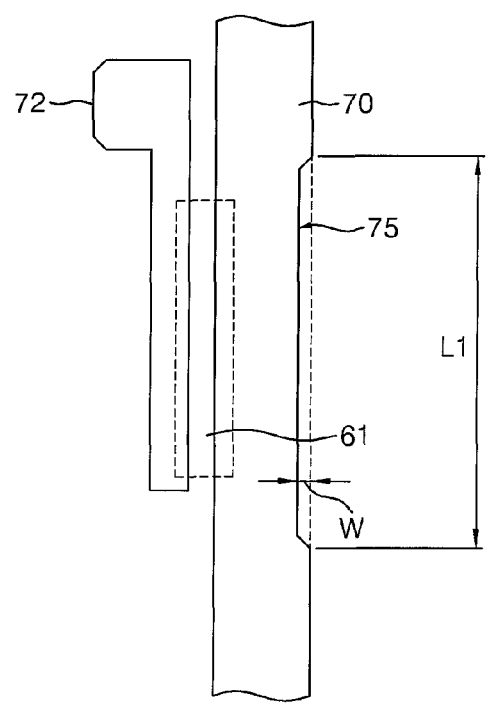

Referring to FIGS. 12A to 12C, a first source electrode 71 and a first drain electrode 72 of the driving transistor TFT1 are formed.

More specifically, a conductive metal is deposited on the overall surface of the substrate 10 by a sputtering method and then patterned by photolithography and etching processes, thus forming the first source electrode 71 and the first drain electrode 72. The first ohmic contact layer 63 not covered but exposed by the first source electrode 71 and the first drain electrode 72 is removed by an etching process to form a channel formed of polysilicon only. A power line 70 is formed simultaneously with the formation of the first source electrode 71. A groove portion 75 is formed on an area of the power line 70 overlapping a storage electrode to be formed later.

The groove portion 75 is formed on a lateral side of the power line 70. Especially, the groove portion 75 is formed on the lateral side of the power line 70 adjacent to a data line 40. Accordingly, it is possible to ensure a left and right margin required when the storage electrode is formed.

Moreover, as shown in FIG. 12C, the groove portion 75 has a length L1 greater than a length of the storage electrode. Accordingly, it is possible to ensure a misalignment margin by setting the length L1 of the groove portion 75 of the power line 70 greater than the length of the storage electrode such that the storage electrode has the same capacity, even if it is shifted to the top or bottom during the formation thereof.

Next, a first gate-insulating layer 31 is formed on the overall surface of the substrate 10.

The first gate-insulating layer 31 is formed by depositing an inorganic insulating material such as silicon oxide (SiOx), silicon nitride (SiNx), or the like on the overall surface of the substrate 10 by a deposition method such as plasma enhanced chemical vapor deposition (PECVD).

Figure 13A:
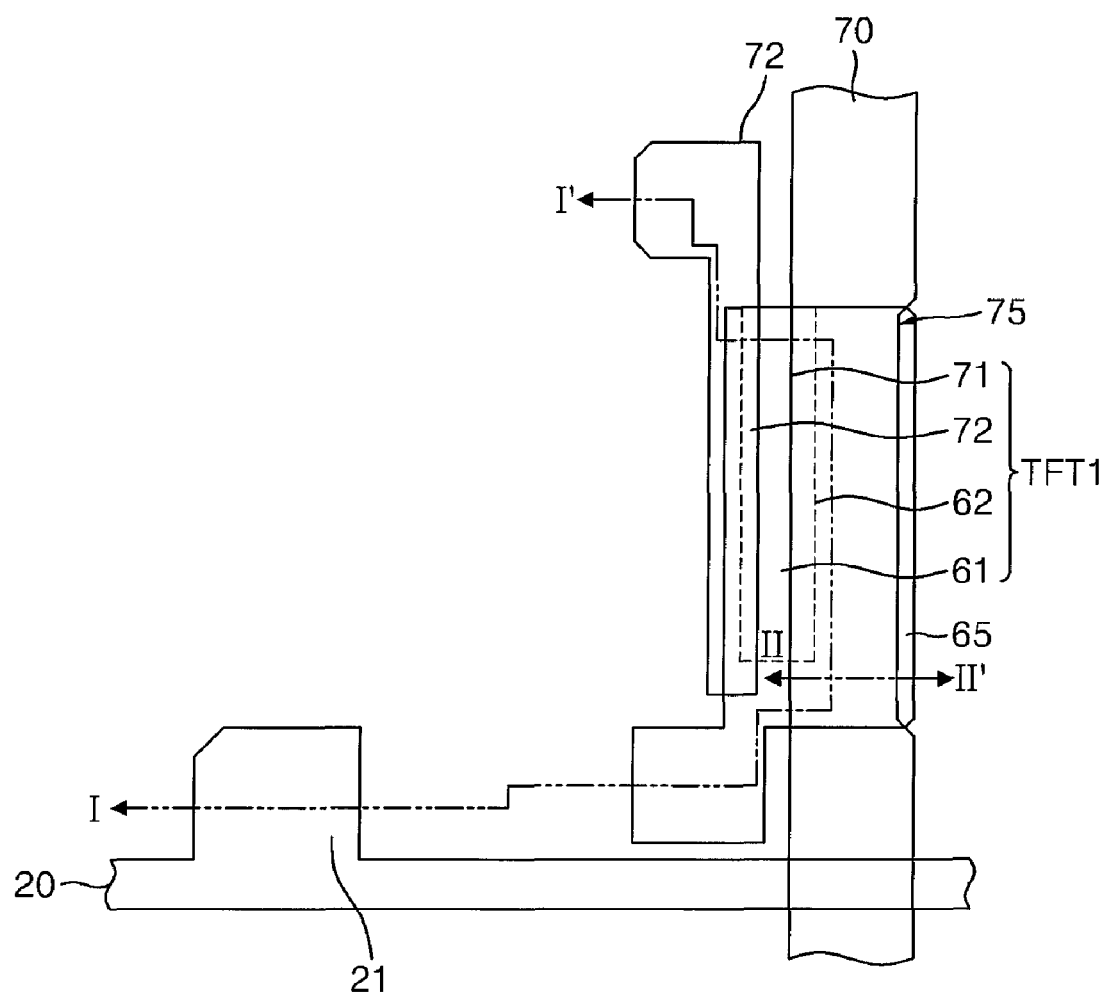
Figure 13B:
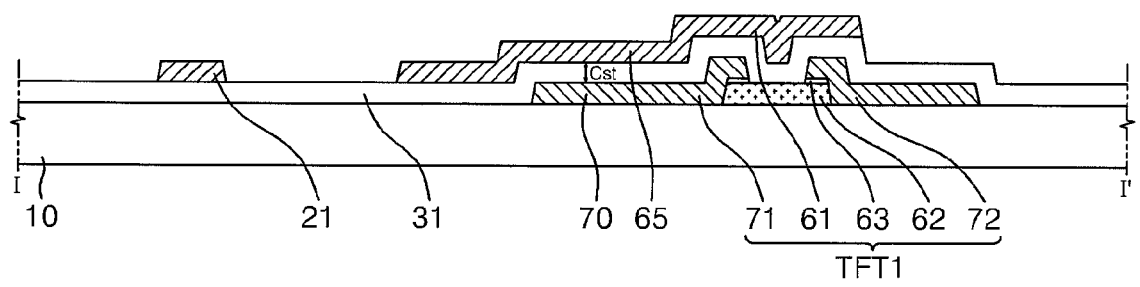
Figure 13C:
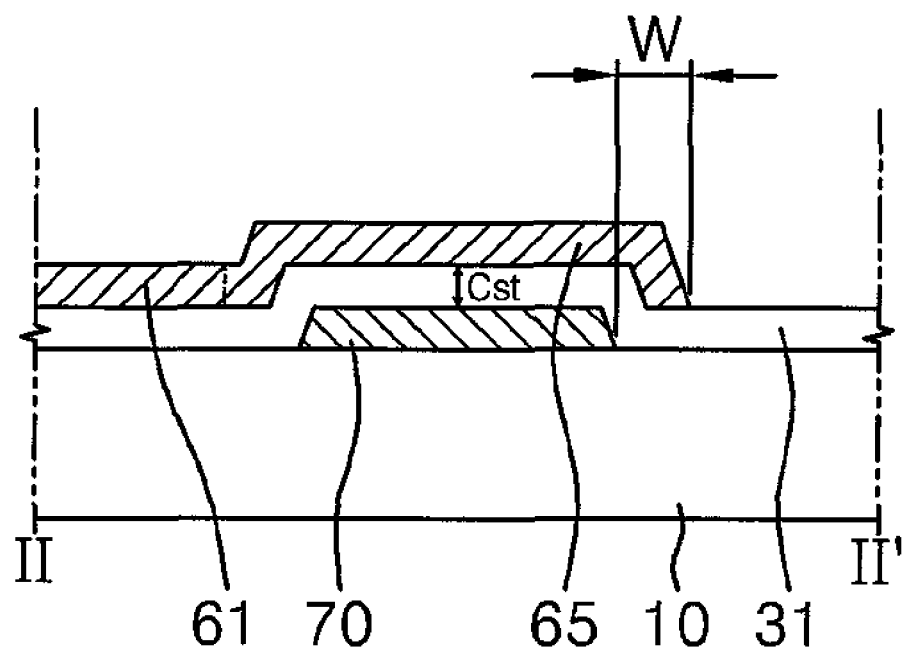

Referring to FIGS. 13A to 13C, a gate line 20, first and second gate electrodes 61 and 21, and the storage electrode 65 are formed on the first gate-insulating layer 31.

In particular, a conductive metal is deposited on the overall surface of the substrate 10 by a sputtering method and then patterned by photolithography and etching processes, thus forming the gate line 20, the first and second gate electrodes 61 and 21 and the storage electrode 65. The second gate electrode 21 is connected to the gate line 20. The power line 70 overlaps the storage electrode 65 with the first gate-insulating layer 31 disposed therebetween to form a storage capacitor Cst.

During the formation of the storage electrode 65, an auxiliary storage electrode 66, which extends from the storage electrode 65 to overlap the power line 70, may be further formed.

Figure 13D:
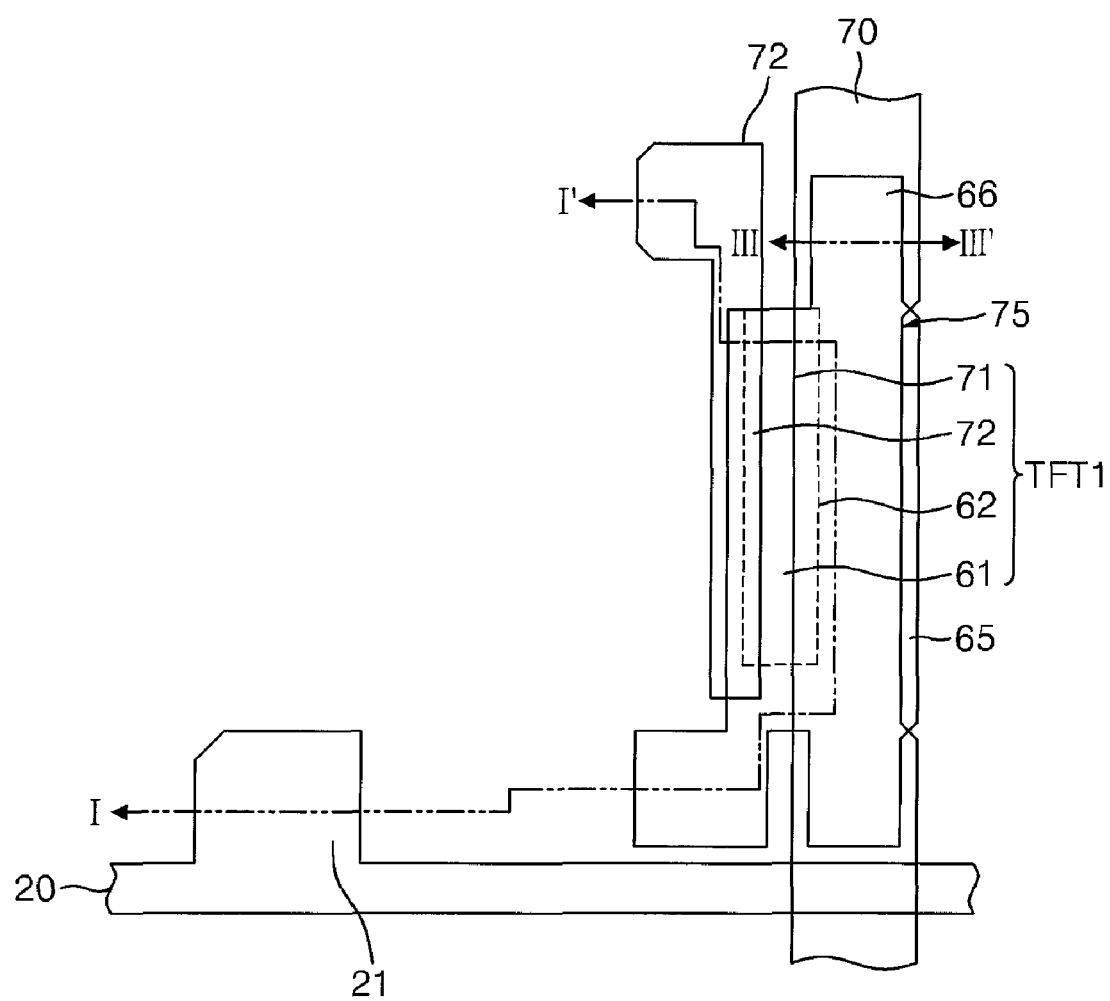
Figure 13E:
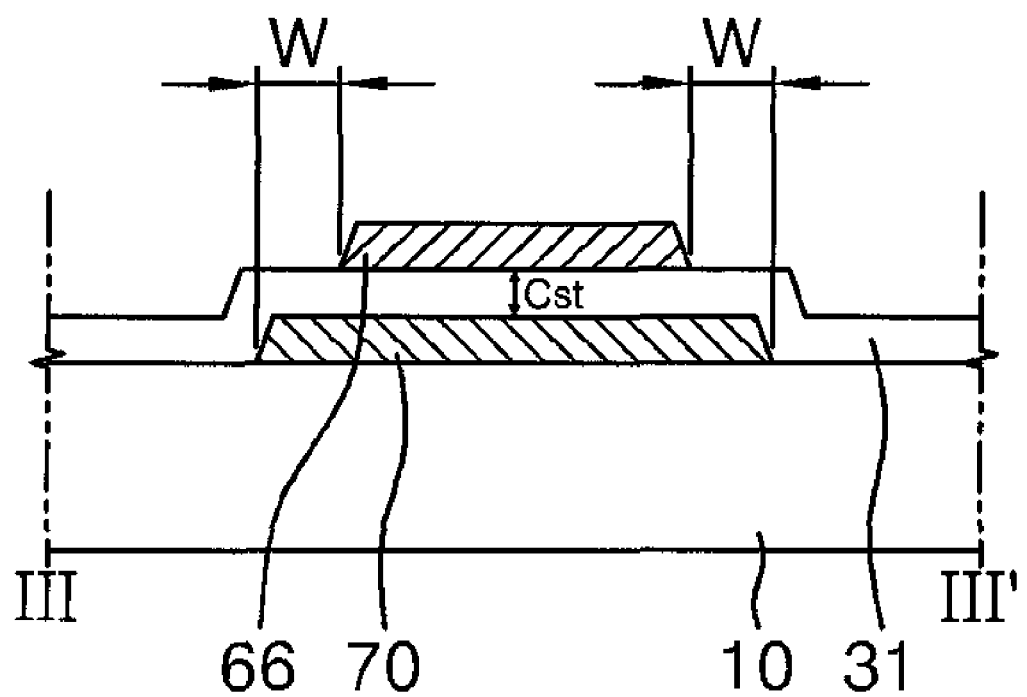

As shown in FIGS. 13D and 13E, the auxiliary storage electrode 66 is formed to overlap the power line 70. The width of the auxiliary storage electrode 66 is set to be smaller or greater than that of the power line 70. The auxiliary storage electrode 66 is formed symmetrically with respect to the center of the power line 70 to have a mask misalignment margin for the left and right direction. The auxiliary storage electrode 66 has a width W on both sides thereof the same as the width of the groove portion 75. Accordingly, even if the storage electrode 65 and the auxiliary storage electrode 66 are shifted to the left or right due to a mask misalignment, the area overlapping the power line 70 is kept the same. Moreover, even when the auxiliary storage electrode 66 has a width greater than that of the power line 70, the auxiliary storage electrode 66 may have a margin as wide as the width W of the groove portion 75.

The width of the auxiliary storage electrode 66 is set to be smaller or larger than that of the power line 70 so that the width W between a lateral side of the auxiliary storage electrode 66 and a lateral side of the power line 70 may be 1 to 2 μm. Where the width of the auxiliary storage electrode 66 is set to be greater than that of the power line 70, the auxiliary storage electrode 66 may be formed to have a size that does not overlap an anode electrode 73 or the adjacent data line 40 to be formed later, even if the auxiliary storage electrode 66 is shifted to the left or right.

Next, a second gate-insulating layer 32 is deposited on the overall surface of the substrate 10 including the first and second gate electrodes 61 and 21. Since the second gate-insulating layer 32 is formed by the same method as the first gate-insulating layer 31, a description thereof will be omitted.

Figure 14A:
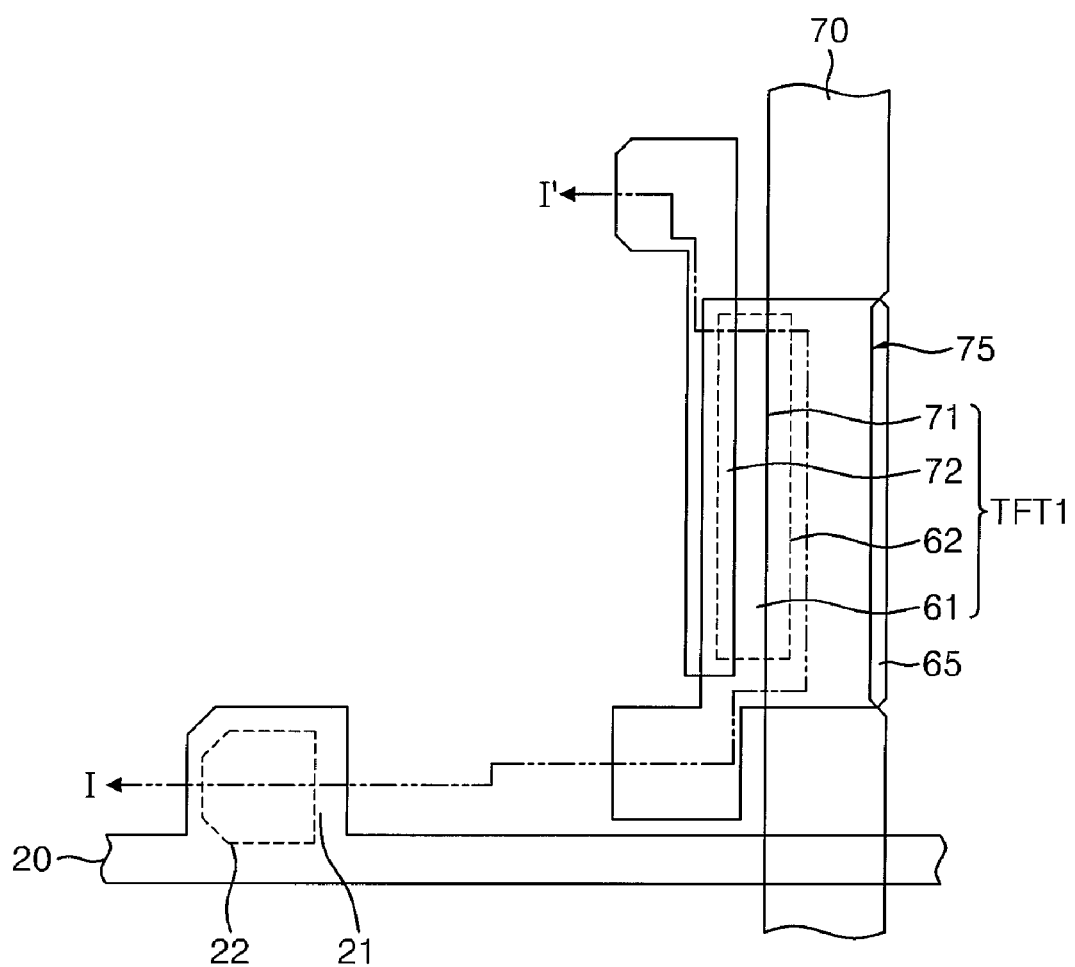
Figure 14B:
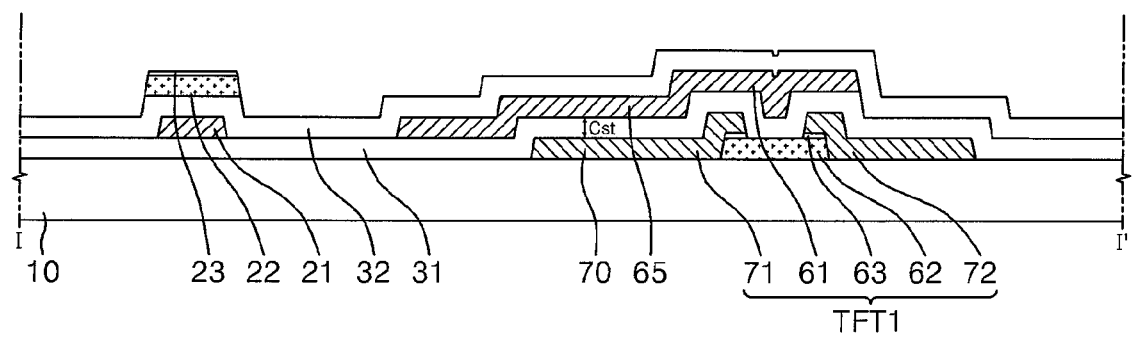

As shown in FIGS. 14A and 14B, a second semiconductor layer 22 and a second ohmic contact layer 23 are formed on the substrate 10 including the second gate-insulating layer 32.

A second semiconductor pattern including the second semiconductor layer 22 and the second ohmic contact layer 23 is formed of amorphous silicon in view of the characteristics of a switching transistor TFT2. That is, amorphous silicon and impurity-doped amorphous silicon are sequentially deposited on the second insulating layer 32 and then patterned by photolithography and etching processes, not subjected to a crystallization process, thus forming the second semiconductor layer 22 and the second ohmic contact layer 23.

Figure 15A:
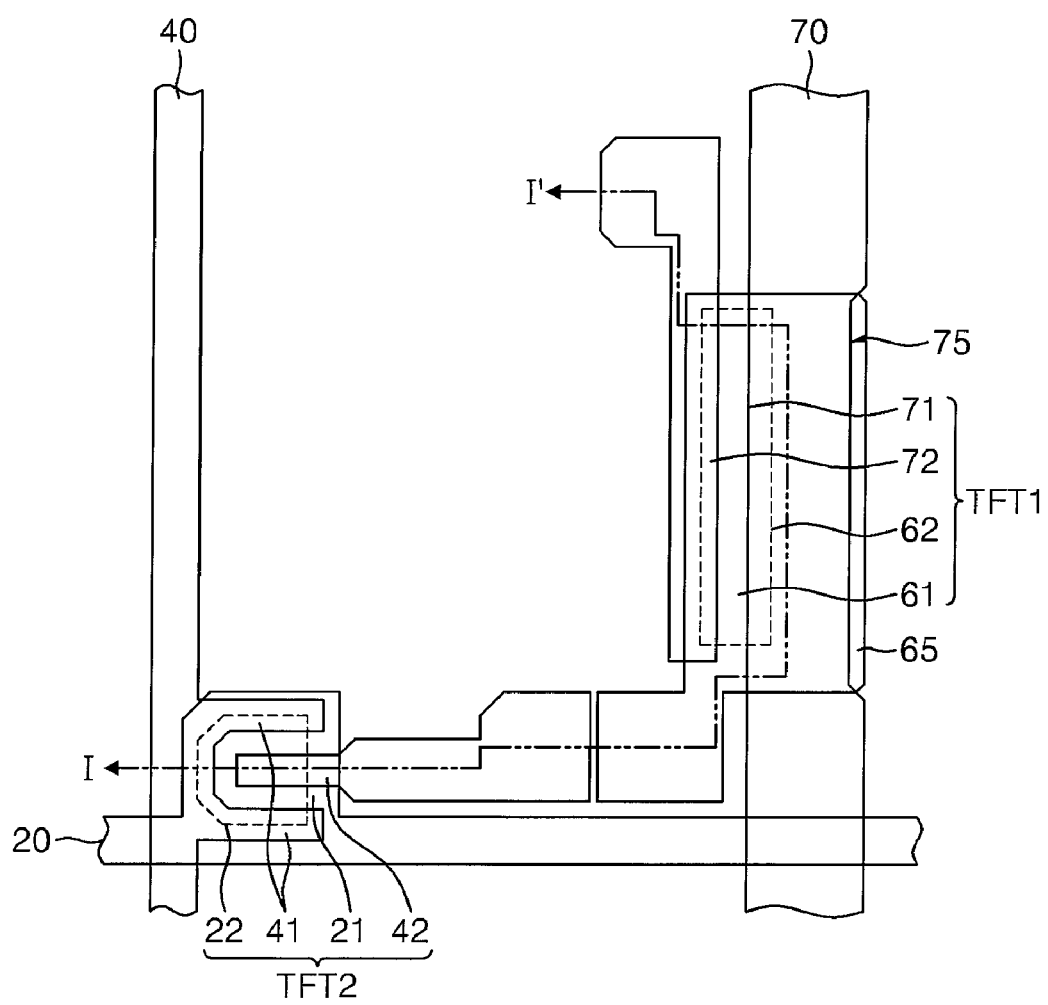
Figure 15B:
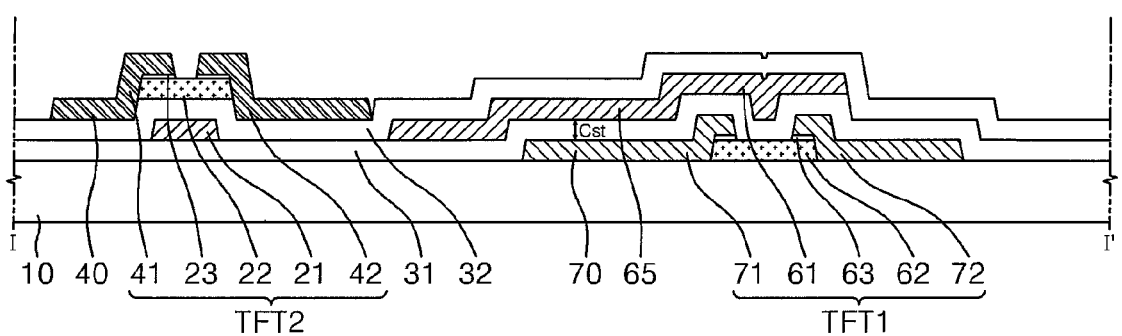

Subsequently, as shown in FIGS. 15A and 15B, a second source electrode 41 and a second drain electrode 42 are formed on the second semiconductor pattern. The data line 40 connected to the second source electrode 41 is formed. Since the process of forming the second source electrode 41, the second drain electrode 42 and the data line 40 is substantially the same as the process of forming the first and second gate electrodes 61 and 21, a description thereof will be omitted.

Figure 16A:
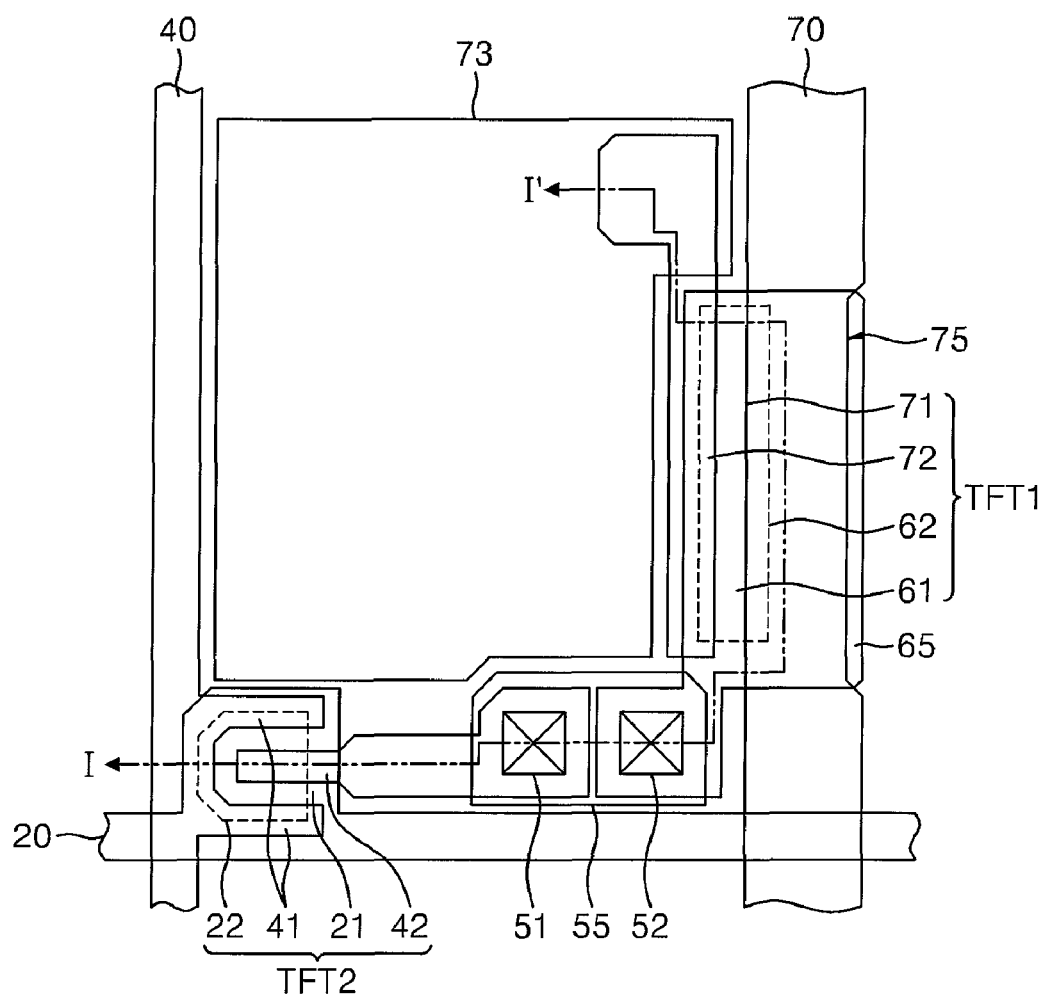
Figure 16B:
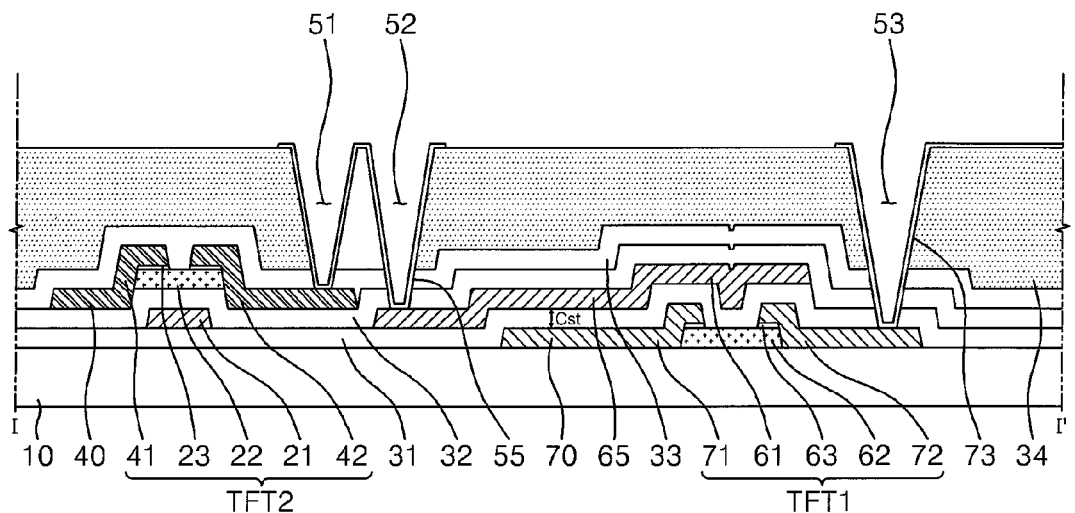

Next, as shown in FIGS. 16A and 16B, a passivation layer 33, an organic planarization layer 34, a bridge electrode 55, and an anode electrode 73 are formed.

The passivation layer 33 is formed by depositing an inorganic insulating layer such as silicon oxide (SiOx) or silicon nitride (SiNx) on the overall surface of the substrate 10. Then, the organic planarization layer 34 is formed on the passivation layer 33. The organic planarization layer 34 is formed by coating an organic material on the overall surface of the passivation layer 33 by a spin coating method, and curing the coated organic material. Subsequently, the organic planarization layer 34 is patterned to form first and second contact holes 51 and 52 and a pixel contact hole 53. The first contact hole 51 is formed to penetrate the organic planarization layer 34 and the passivation layer 33, thus exposing a portion of the second drain electrode 42. The second contact hole 52 is formed to penetrate the organic planarization layer 34, the passivation layer 33, and the second gate-insulating layer 32, thus exposing a portion of the first gate electrode 61. The pixel contact hole 53 is formed to penetrate the organic planarization layer 34, the passivation layer 33, and the first and second gate-insulating layers 31 and 32 sequentially, thus exposing a portion of the first drain electrode 72.

Figure 16C:
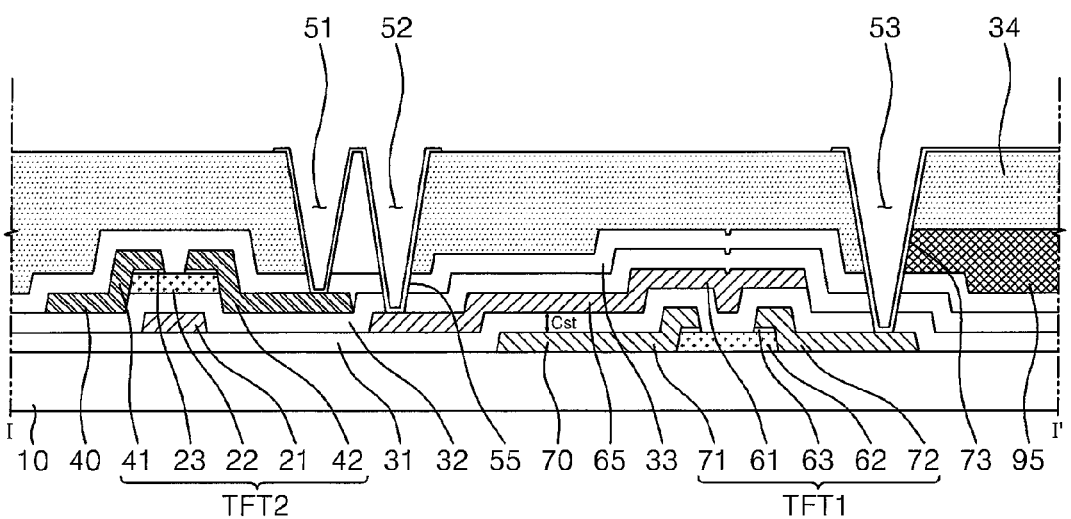

A color filter 95 may be further formed during the formation of the organic planarization layer 34 as shown in FIG. 16C.

Any one of red, green, and color filters 95 is formed at each pixel area prior to the formation of the organic planarization layer 34 and then the organic planarization layer 34 is formed on the color filter 95. Here, the color filter 95 may be formed of an organic material displaying color.

The organic planarization layer 34 may comprise the color filter. That is, it is possible to form the organic planarization layer 34 at each pixel area as the color filter displaying color.

Next, the bridge electrode 55 and the anode electrode 73 are formed of a transparent conductive layer. The bridge electrode 55 and the anode electrode 73 are formed in such a manner that a transparent conductive material such as indium tin oxide (ITO), indium zinc oxide (IZO), and indium tin zinc oxide (ITZO) is deposited on the organic planarization layer 34, on which the first and second contact holes 51 and 52 and the pixel contact hole 53 are formed, by a sputtering method, and patterned by photolithography and etching processes. The bridge electrode 55 connects the first gate electrode 61 to the second drain electrode 42. The anode electrode 73 is connected to the first drain electrode 72 of the driving transistor TFT1.

Figure 17A:
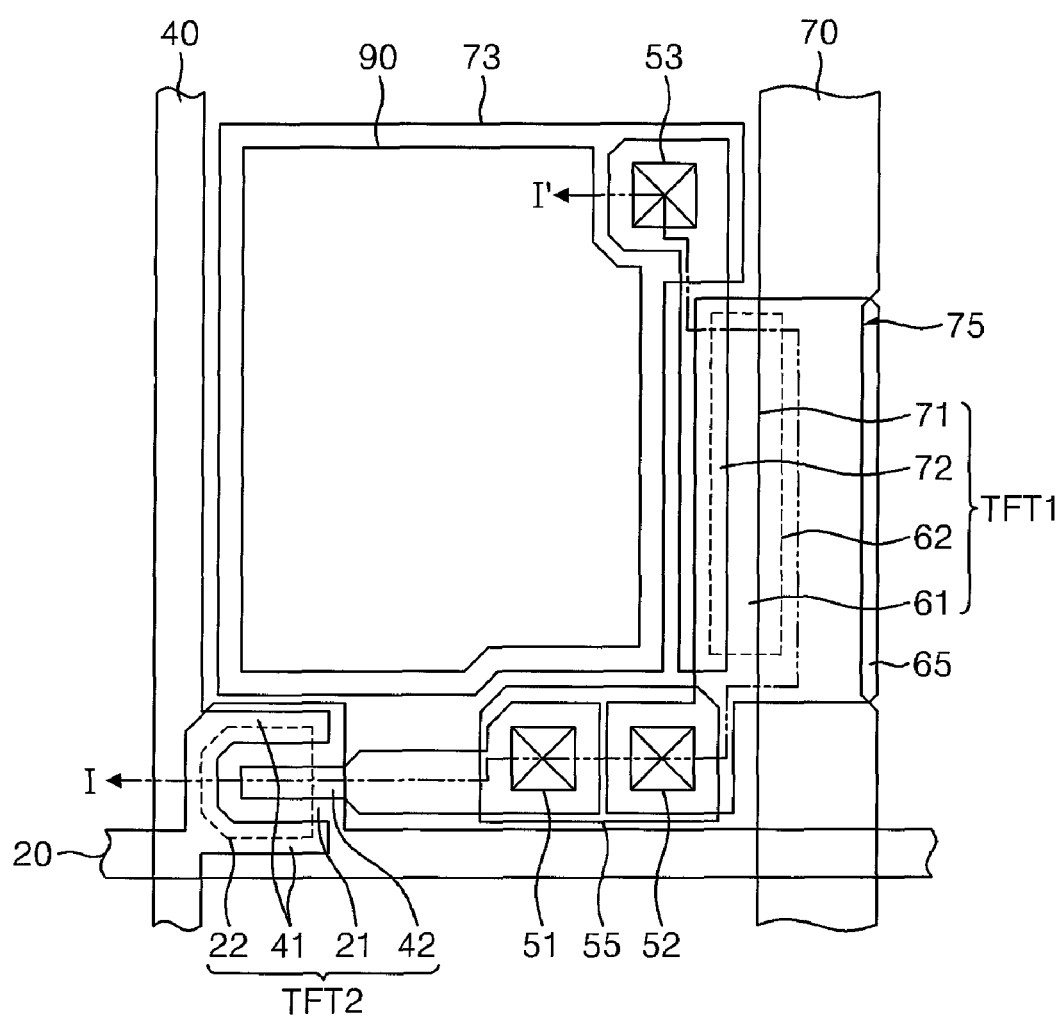
Figure 17B:
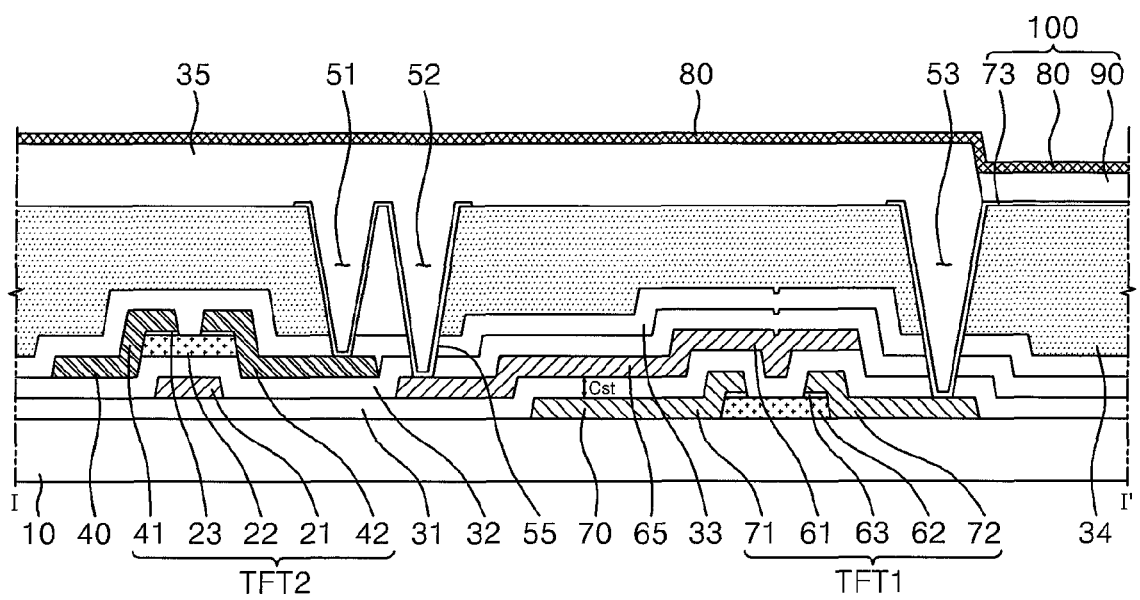

Referring to FIGS. 17A and 17B, a barrier layer 35, an organic light-emitting layer 90, and a cathode electrode 80 are formed on the substrate 10 including the bridge electrode 55 and the anode electrode 73.

At least one material of acrylic-based resin, benzocyclobutene (BCB), and polyimide is deposited on the overall surface on the substrate 10 including the bridge electrode 55 and the anode electrode 73. Subsequently, the anode electrode 73 is exposed by photolithography and etching processes. Accordingly, a step height is formed between an area where the anode electrode 73 is formed and the other area which is not etched. Next, the organic light-emitting layer 90 is formed on the anode electrode 73 in the barrier layer 35, and the cathode electrode 80 is formed on the barrier layer 35 and the organic light-emitting layer 90.

As described above, the power line and the storage electrode which form the storage capacitor are formed taking into account variations in processing. It is thus possible to form the storage capacitor at each pixel area of the organic light-emitting panel having the same capacity, even if mask misalignment should occur during the manufacturing process.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic light-emitting display panel comprising:
   a gate line and a data line formed to cross each other on a substrate;
   an organic light-emitting diode formed in a pixel area defined by the intersection of the gate line and the data line;
   a power line formed parallel to the data line for supplying an electric current to the organic light-emitting diode;
   a switching transistor provided at the intersection of the gate line and the data line;
   a driving transistor connected to the switching transistor and the power line to control the current supplied from the power line; and
   a storage capacitor composed of a storage electrode overlapping the power line with a first gate-insulating layer disposed therebetween,
   wherein the storage capacitor includes a groove portion formed on a lateral side of the power line overlapping the storage electrode so that the overlapping area of the power line and the storage electrode is kept constant.

2. The organic light-emitting display panel of claim 1, wherein the groove portion is formed on a lateral side adjacent to the data line.

3. The organic light-emitting display panel of claim 2, wherein the groove portion has a length at least equal to or greater than a length between the top and bottom of the storage electrode.

4. The organic light-emitting display panel of claim 3, wherein the storage electrode has a width greater than that of an overlapping area of the storage electrode and the power line.

5. The organic light-emitting display panel of claim 2, further comprising an auxiliary storage electrode extending from the storage electrode to overlap the power line.

6. The organic light-emitting display panel of claim 5, wherein the auxiliary storage electrode has a width smaller or larger than that of the power line.

7. The organic light-emitting display panel of claim 1, wherein the driving transistor comprises:
   a first semiconductor pattern formed of polysilicon on the substrate;
   a first source electrode formed on the first semiconductor pattern and connected to the power line;
   a first drain electrode formed on the first semiconductor pattern to face the first source electrode and connected to the organic light-emitting diode;
   a second gate-insulating layer formed on the first source electrode and the first drain electrode; and
   a first gate electrode formed on the second gate-insulating layer to overlap the first semiconductor pattern.

8. The organic light-emitting display panel of claim 7, wherein the first gate electrode is electrically connected to the storage electrode.

9. The organic light-emitting display panel of claim 1, wherein the switching transistor comprises:
   a second gate electrode formed on the first gate-insulating layer;
   the second gate-insulating layer formed on the second gate electrode;
   a second semiconductor pattern formed of amorphous silicon on the substrate; and
   a second source electrode and a second drain electrode formed on the second semiconductor pattern to face each other.

10. The organic light-emitting display panel of claim 9, further comprising a bridge electrode connecting the first gate electrode to the second drain electrode.

11. A method of manufacturing an organic light-emitting display panel, the method comprising:
   forming a gate line and a data line on a substrate, the gate line and the data line crossing each other with a gate-insulating layer disposed therebetween;
   forming an organic light-emitting diode in a pixel area defined by the intersection of the gate line and the data line;
   forming a switching transistor at the intersection of the gate line and the data line;
   forming a driving transistor connected to the switching transistor;
   forming a power line parallel to the data line; and
   forming a storage electrode overlapping the power line with the gate-insulating layer disposed therebetween to form a storage capacitor and including a projecting portion with respect to a lateral side of the power line wherein forming the power line parallel to the data line further comprises forming a groove portion on a lateral side adjacent to the data line in an overlapping area of the storage electrode and the power line.

12. The method of claim 11, wherein forming the groove further comprises forming the groove portion to have a length at least equal to or greater than a length between the top and bottom of the storage electrode.

13. The method of claim 11, wherein forming the storage electrode further comprises forming an auxiliary storage electrode extending from the storage electrode to overlap the power line.

14. The method of claim 13, wherein forming the auxiliary storage electrode further comprises forming the auxiliary storage electrode to have a width smaller or larger than that of the power line.

15. The method of claim 11, wherein forming the switching transistor and the driving transistor comprises:
   forming a first semiconductor pattern with polysilicon on the substrate and a first gate-insulating layer;
   forming a source electrode on the first semiconductor pattern and connected to the power line, and a first drain electrode facing the first source electrode;
   forming a second gate-insulating layer on the first source electrode and the first drain electrode;
   forming a first gate electrode on the second gate-insulating layer to overlap the first semiconductor pattern, and a second gate electrode simultaneously with the first gate electrode; and
   forming a third gate-insulating layer, a second semiconductor pattern, a second source electrode, and a second drain electrode.

* * * * *